United States Patent [19]

Suzuki

[11] Patent Number: 5,177,367
[45] Date of Patent: Jan. 5, 1993

[54] METHOD OF EXPOSURE USING AN ELECTRON BEAM TO PROVIDE UNIFORM DOSAGE AND APPARATUS THEREFOR

[75] Inventor: Toshiyuki Suzuki, Yokohama, Japan

[73] Assignee: Kabushiki Kaisha Toshiba, Kawasaki, Japan

[21] Appl. No.: 625,995

[22] Filed: Dec. 12, 1990

[30] Foreign Application Priority Data

Dec. 12, 1989 [JP] Japan ................... 1-322225

[51] Int. Cl.$^5$ .................... H01J 3/08; H01L 21/027
[52] U.S. Cl. ....................... 250/492.2; 250/492.1; 250/492.3; 250/398
[58] Field of Search ........... 250/492.2, 492.1, 492.23, 250/492.22, 492.3, 398; 430/296

[56] References Cited

U.S. PATENT DOCUMENTS

| | | | |
|---|---|---|---|
| 4,449,051 | 5/1984 | Berkowitz | 250/492.21 |
| 4,463,265 | 7/1984 | Owen et al. | 250/492.2 |

FOREIGN PATENT DOCUMENTS

| | | | |
|---|---|---|---|
| 0035921 | 3/1983 | Japan | 250/492.2 |
| 0130522 | 8/1983 | Japan | 250/492.2 |
| 0130523 | 8/1983 | Japan | 250/492.2 |
| 0022325 | 2/1984 | Japan | 250/492.2 |
| 63-58829 | 3/1988 | Japan | |

OTHER PUBLICATIONS

Japanese Patent Abstract 63-58829, Dated Mar. 14, 1988.
Journal of Vacuum Science and Technology, Oct.–Dec. 1983, "Proximity Effect Correction on Substractes etc."

*Primary Examiner*—Jack I. Berman
*Assistant Examiner*—James Beyer
*Attorney, Agent, or Firm*—Foley & Lardner

[57] ABSTRACT

There are disclosed an electron exposure method and an apparatus therefor used in a process for preparing a semiconductor manufactuirng mask. In accordance with this invention, in irradiating an electron beam onto a mask blank, an irradiation is conducted in a manner to relatively decrease a beam current so that a dose quantity of the electron beam to be irradiated becomes uniform on the surface of the mask blank as the irradiation position shifts from the central portion to the peripheral portion apt to be subjected to fogging exposure of the surface of the mask blank.

2 Claims, 9 Drawing Sheets

X – DIRECTION

FIG. 3

Y – DIRECTION

METHOD OF EXPOSURE USING AN ELECTRON BEAM TO PROVIDE UNIFORM DOSAGE AND APPARATUS THEREFOR

BACKGROUND OF THE INVENTION

This invention relates to an electron beam exposure method and an apparatus therefor in a process preparing a mask for manufacturing of a semiconductor device.

In the case of preparing a mask for manufacturing a semiconductor device, an electron beam exposure apparatus is used to irradiate an electron beam onto a mask blank to conduct an exposure.

An electron beam outputted from an electron gun is irradiated onto a mask blank mounted on a cassette.

However, when an electron beam is irradiated onto the mask blank, it is also irradiated on a cassette portion outside the mask blank to be irradiated. A so called fogging exposure is produced such that the electron beam irradiated onto the cassette is reflected on the upper surface thereof and is reflected on the lower surface of an aperture, and is then excessively irradiated onto the mask blank for a second time. Generally, fogging exposure is hardly produced at the central portion of the mask blank, and fogging exposure is produced to a greater degree as the irradiation position becomes closer to the periphery.

If such a phenomenon takes place, there occur the circumstances equivalent to the case where an electron beam of a fixed dose quantity was not irradiated on the mask blank. Namely, as the irradiation position shifts from the central portion which has not undergone fogging exposure to the peripheral portion, the quantity of irradiation of the electron beam gradually increases. As a result, when the mask blank is developed, there would occur unevenness in the pattern dimension or size which should be originally the same dimension even if the development time is fixed.

Figure 1:
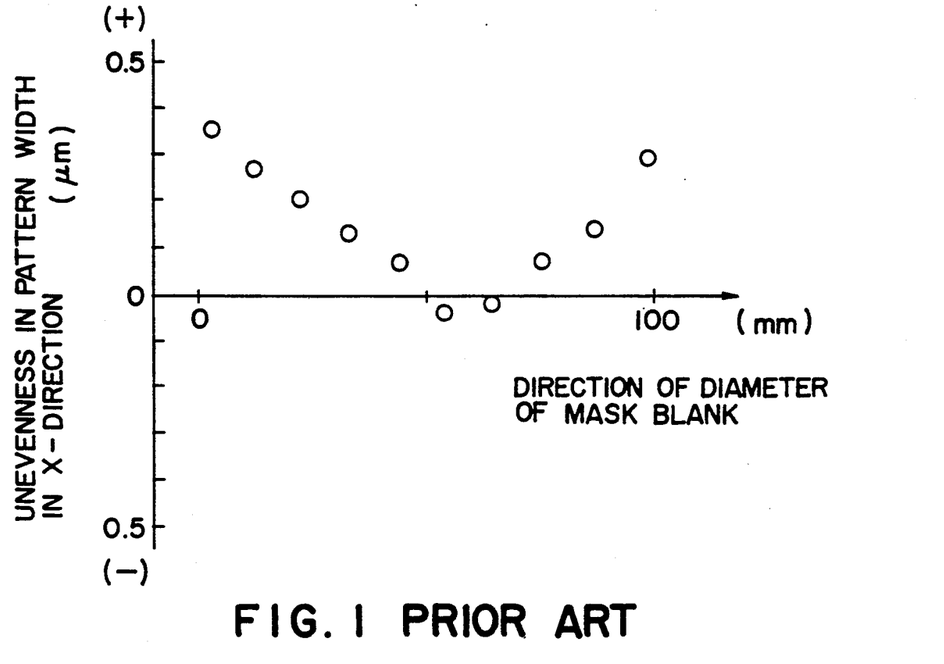
FIG. 1 is a graph showing the result obtained by measuring unevenness in an X-direction of the pattern dimension in the case where exposure processing is implemented by a conventional method.
Figure 2:
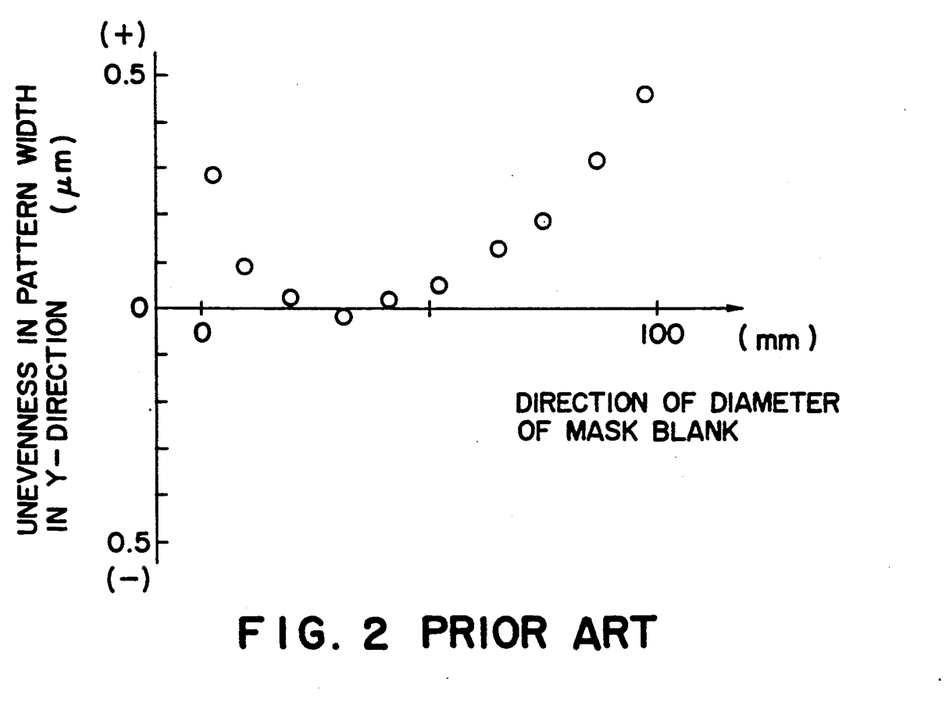
FIG. 2 is a graph showing the result obtained by measuring the unevenness in the Y-direction of the pattern dimension in the case where exposure processing is implemented by the conventional method.

The result obtained by measuring such an unevenness in the pattern dimension is shown below. In FIG. 1, a square mask blank having one side of 100 mm is taken as an example, wherein unevenness in an X-direction of the pattern dimension is taken on the ordinate and a position in a direction of diameter corresponding to a wafer on the mask blank is taken on the abscissa. FIG. 2 shows the result obtained by measuring unevenness in a Y-direction of the pattern dimension in the same manner as in FIG. 1.

Figure 3:
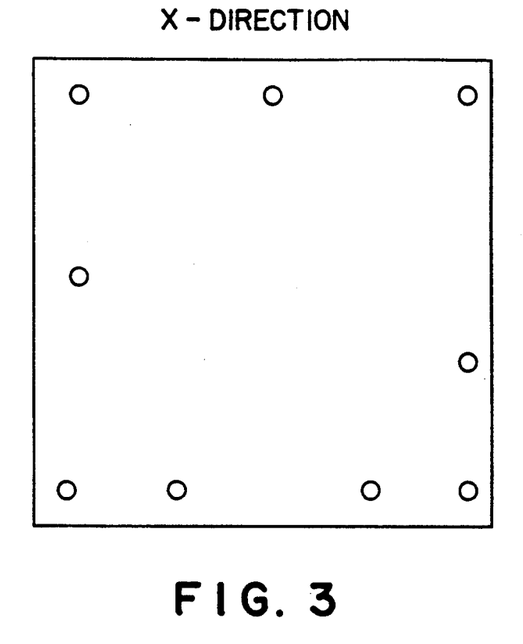
FIG. 3 is a distribution diagram on a mask substrate showing positions having an unevenness more than 0.18 μm in the pattern dimension in an X-direction in the case where exposure processing is implemented by the conventional method.
Figure 4:
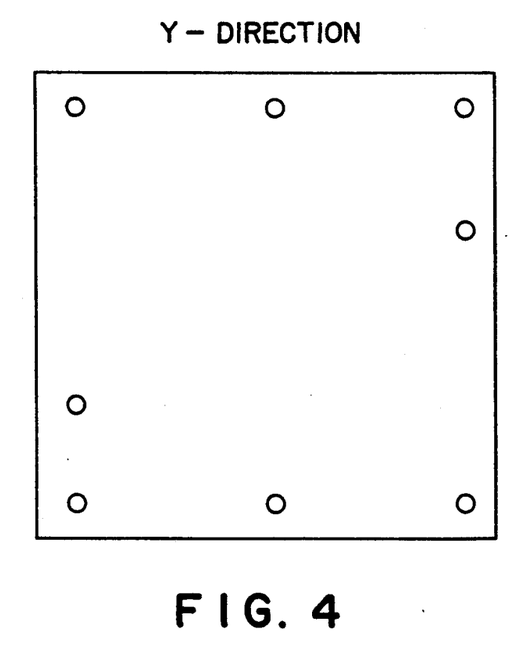
FIG. 4 is a distribution diagram on a mask substrate showing positions having an unevenness more than 0.18 μm in the pattern dimension in a Y-direction in the case where exposure processing is implemented by the conventional method.

Furthermore, a position on the mask blank where an unevenness (in X-direction) of the pattern dimension more than 0.18 μm is detected is shown in FIG. 3. This represents the positional relationship in the state when viewed from the upper direction of the mask blank. FIG. 4 shows a position on the mask blank where unevenness more than 0.18 μm in a Y-direction is detected.

As is clear from the measured results mentioned above, as the measurement position shifts from the central portion toward the peripheral portion of the mask blank, unevenness in the dimension increases. Such an unevenness in the pattern dimension leads to a lowering of the manufacturing yield or reliability,

SUMMARY OF THE INVENTION

Accordingly, an object of this invention is to provide an electron beam exposure method and an apparatus therefor which can prevent unevenness in the pattern dimension from occurring by fogging exposure in irradiating an electron beam onto the mask blank.

In accordance with this invention, there is provided a method of applying an exposure onto a semiconductor manufacturing mask blank using an electron beam, wherein, in irradiating an electron beam onto the mask blank, an irradiation is conducted in a manner to relatively decrease a beam current so that a dose quantity of the electron beam to be irradiated becomes uniform on the surface of the mask blank as the irradiation position shifts from the central portion to the peripheral portion apt to be subjected to fogging exposure of the surface of the mask blank.

In irradiating an electron beam onto the mask blank, an approach is employed to relatively decrease a beam current as the irradiation position shifts from the central portion to the peripheral portion apt to be subjected to fogging exposure of the surface of the mask blank to irradiate the electron beam while adjusting a dose quantity thereof. Thus, a quantity of irradiation of the electron beam is relatively decreased as the irradiation position becomes closer to the peripheral portion subjected to fogging exposure. As a result, a dose quantity of an electron beam irradiated becomes uniform on the mask blank. Thus, the occurrence of unevenness of the pattern dimension is prevented.

Furthermore, in accordance with this invention, there is provided an apparatus for applying an exposure onto a semiconductor manufacturing mask blank using an electron beam, which comprises an electron gun for outputting an electron beam onto the surface of the mask blank, and a beam current control means for adjusting a dose quantity of an electron beam outputted from the electron gun by controlling a beam current, wherein the beam current control means effects control to decrease a beam current as the irradiation position shifts from the central portion to the peripheral portion apt to be subjected to exposure of the surface of the mask blank.

As stated above, the electron beam exposure apparatus according to this invention is provided with beam current control means for effecting control to decrease a beam current as the irradiation position shifts from the central portion to the peripheral portion of the surface of the mask blank in outputting an electron beam from the electron gun. Accordingly, since an exposure is conducted by the apparatus mentioned above, unevenness in the pattern can be reduced.

DESCRIPTION OF THE PREFERRED EMBODIMENT

An electron beam exposure method and an apparatus therefor according to an embodiment of this invention will now be described with reference to the attached drawings.

Figure 5:
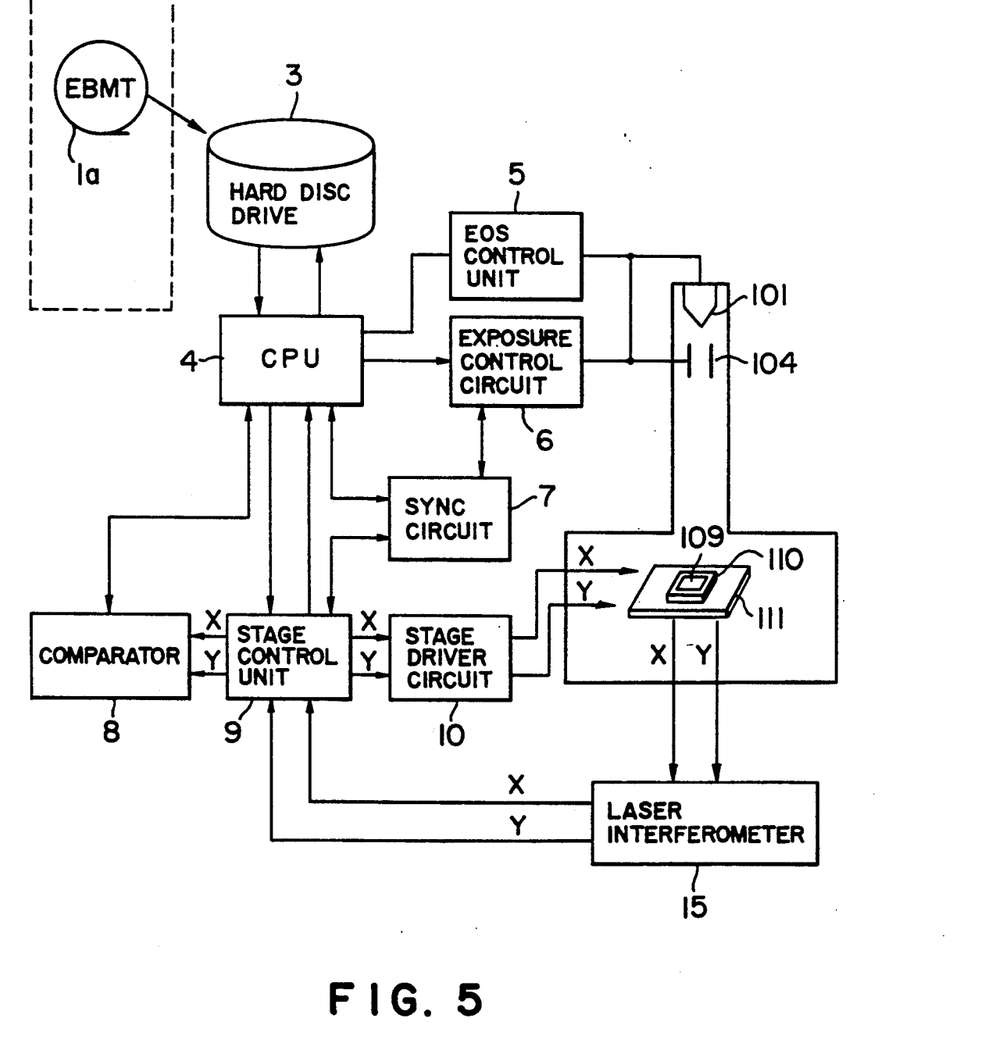
FIG. 5 is a block diagram showing the configuration of an electron beam exposure apparatus according to an embodiment of this invention.

In this embodiment, an exposure processing is implemented by using an electron beam exposure apparatus as shown in FIG. 5. Data 1a for an exposure pattern stored on a magnetic tape 1 is transferred to a hard disk drive 3. A CPU 4 carries out, by using such data, an exposure control of an electron beam outputted from an electron gun 101.

An EOS (Electro-Optical System) control unit 5 adjusts a focal point of a beam current, or varies a bias value of a grid within the electron gun 101, thereby to control the magnitude of the beam current. In this case, the EOS control unit 5 carries out control such that a beam current gradually decreases from the central portion toward the peripheral portion of a mask blank 109. An exposure control circuit 6 controls an applied voltage to a blanking electrode 104 to carry out an ON/OFF control of an electron beam.

Figure 6:
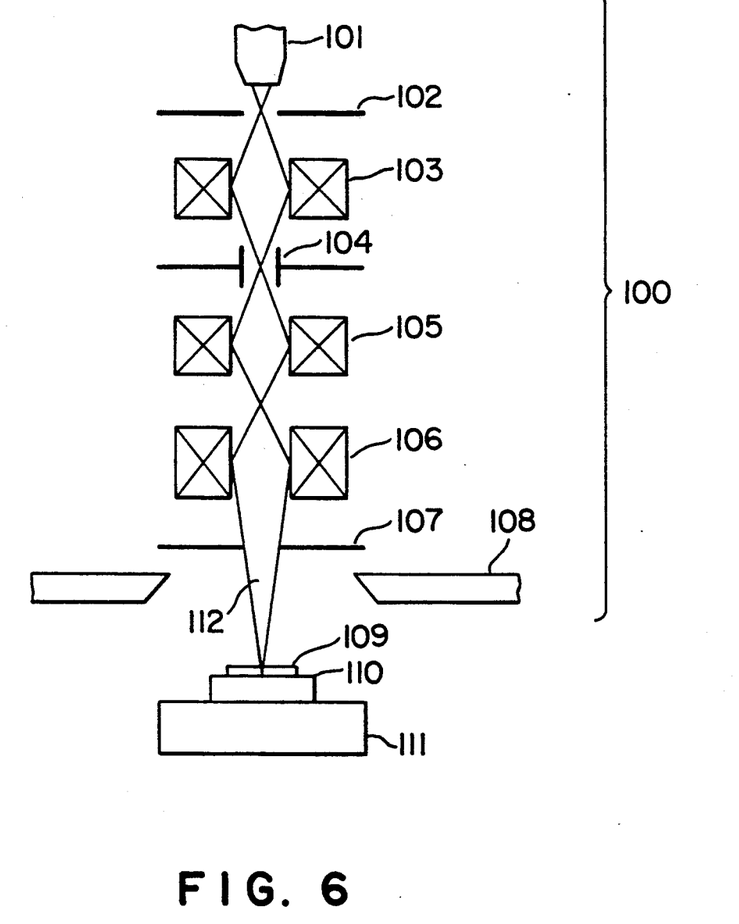
FIG. 6 shows, in a block form, the enlarged configuration of the portion where an electron beam is outputted in the electron beam exposure apparatus.

The enlarged configuration of the portion where an electron beam is outputted from the electron beam exposure apparatus is shown in a block form in FIG. 6.

An electron beam 112 outputted from the electron gun 101 is accelerated by an anode 102. After the electron beam is focused by a first condenser lens 103 and a second condenser lens 105, it is passed through an object lens 106, and an aperture 107 for prevention of reflection. Then, the electron beam 112 is irradiated onto the mask blank 109 mounted on a cassette 110 grounded on a stage 111. When the electron beam 112 is passed through the blanking electrode 104, irradiation onto the mask blank 109 is subjected to ON/OFF control. Further, the electron beam 112 reflected by the mask blank 109, etc. is detected by a reflection type electron detector 108.

The mask blank 109 to which the electron beam 112 has been irradiated subsequently undergoes respective processes of development, rinse, soft bake, and etching in succession.

Returning to FIG. 5 for a second time, the stage 111 on which the mask blank 109 is mounted is driven by a stage driver circuit 10. First, positions in X- and Y-directions of the stage 111 are measured by a laser interferometer 15. The results thus measured are delivered to a comparator 8 through a stage control unit 9, and are compared with reference positions, respectively. Thereafter, a direction to be moved and a quantity of movement are determined by CPU 4. Then, the stage driver circuit 10 is controlled by the stage control circuit 9 on the basis of the direction and the quantity of movement which have been determined. At the same time, a synchronization (SYNC) circuit 7 outputs, to the exposure control circuit 6, position information of the stage 111 obtained from the stage control unit 9, thus allowing the position and the irradiation position of an electron beam to be synchronous with each other.

When the exposure apparatus thus constructed is used to irradiate an electron beam onto the mask blank 109, the EOS control unit 5 carries out a control such that the magnitude of a beam current is decreased as the irradiation position shifts from the central portion toward the peripheral portion of the mask blank 109.

How the beam current is determined will now be described.

The pattern width generally varies in dependency upon the beam current and the development time.

Figure 7:
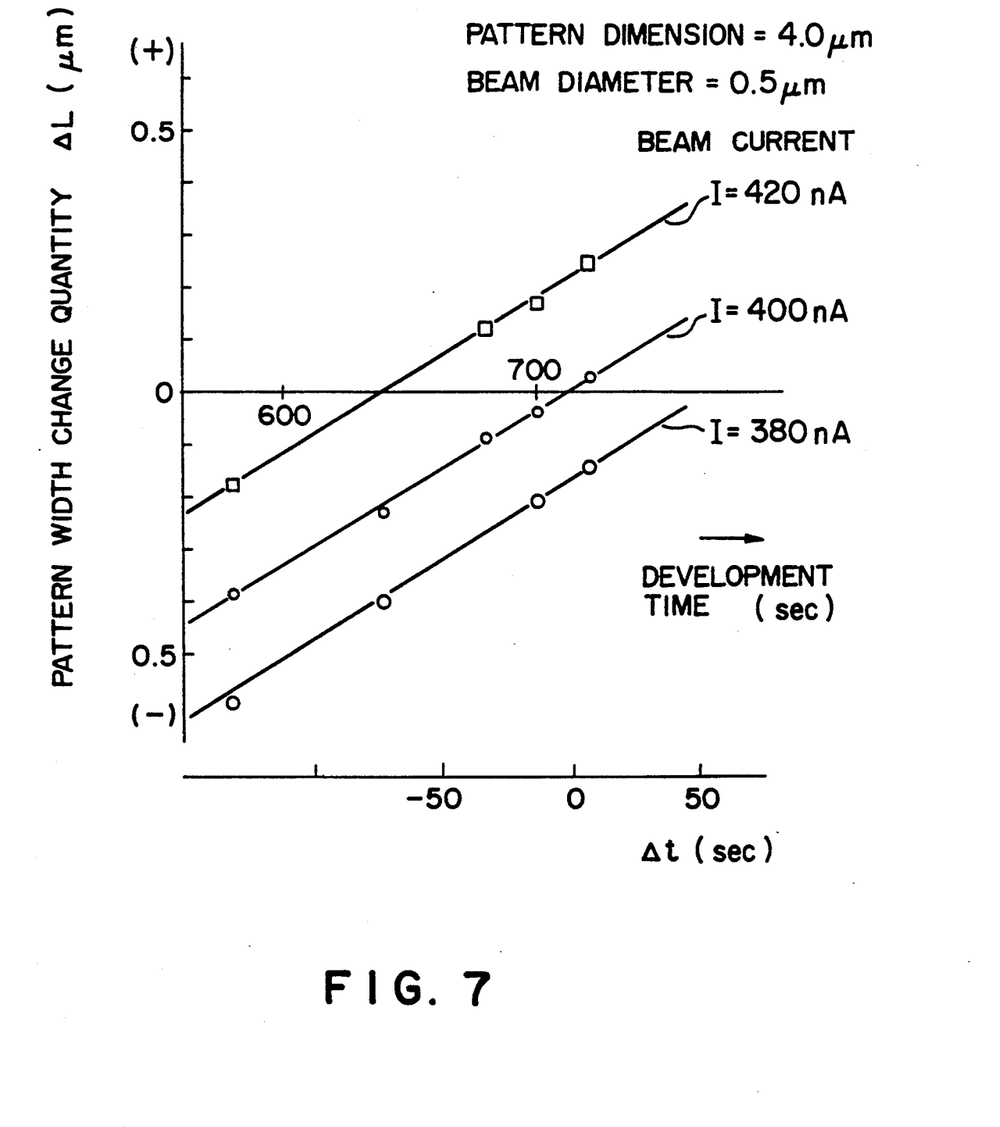
FIG. 7 is a graph showing the relationship between a development time and a pattern width change quantity.

FIG. 7 is a graph showing a pattern width dimension change quantity $\Delta L$ in the case of varying the beam current and the development time when the pattern width dimension and the beam diameter are assumed to be 4.0 $\mu$m and 0.5 $\mu$m, respectively. From this graph, a change quantity $\Delta L$ is expressed as follows:

$$\Delta L = \frac{I - 400}{10} \times 0.1 + \frac{0.08}{30} \times \Delta t \, (\mu m)$$

Figure 8:
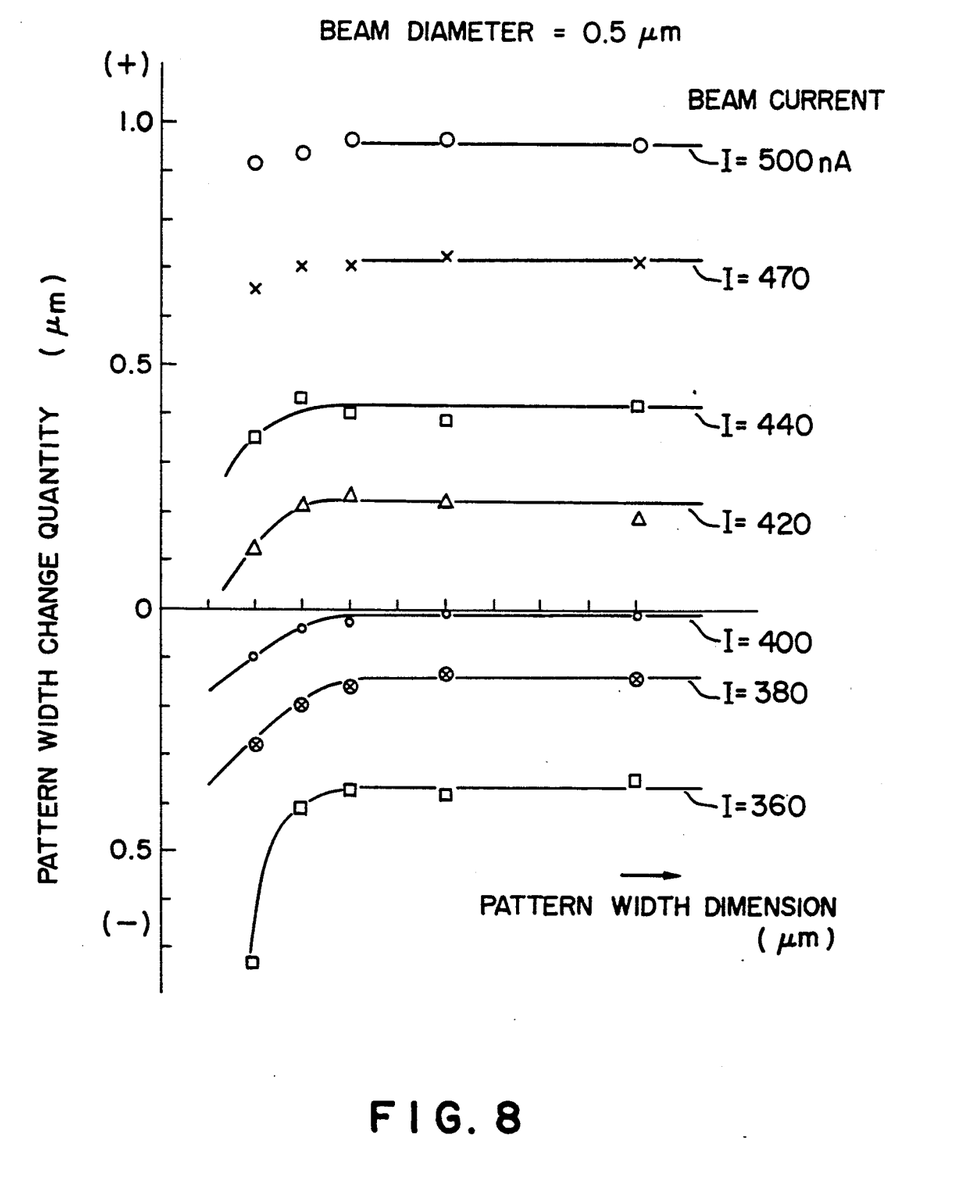
FIG. 8 is a graph showing the relationship between a pattern width and a pattern width change quantity when a beam current is used as a parameter.

FIG. 8 is a graph showing how the pattern width dimension is varied by the beam current when the development time is set to a fixed value of, e.g., 710 seconds.

Figure 9:
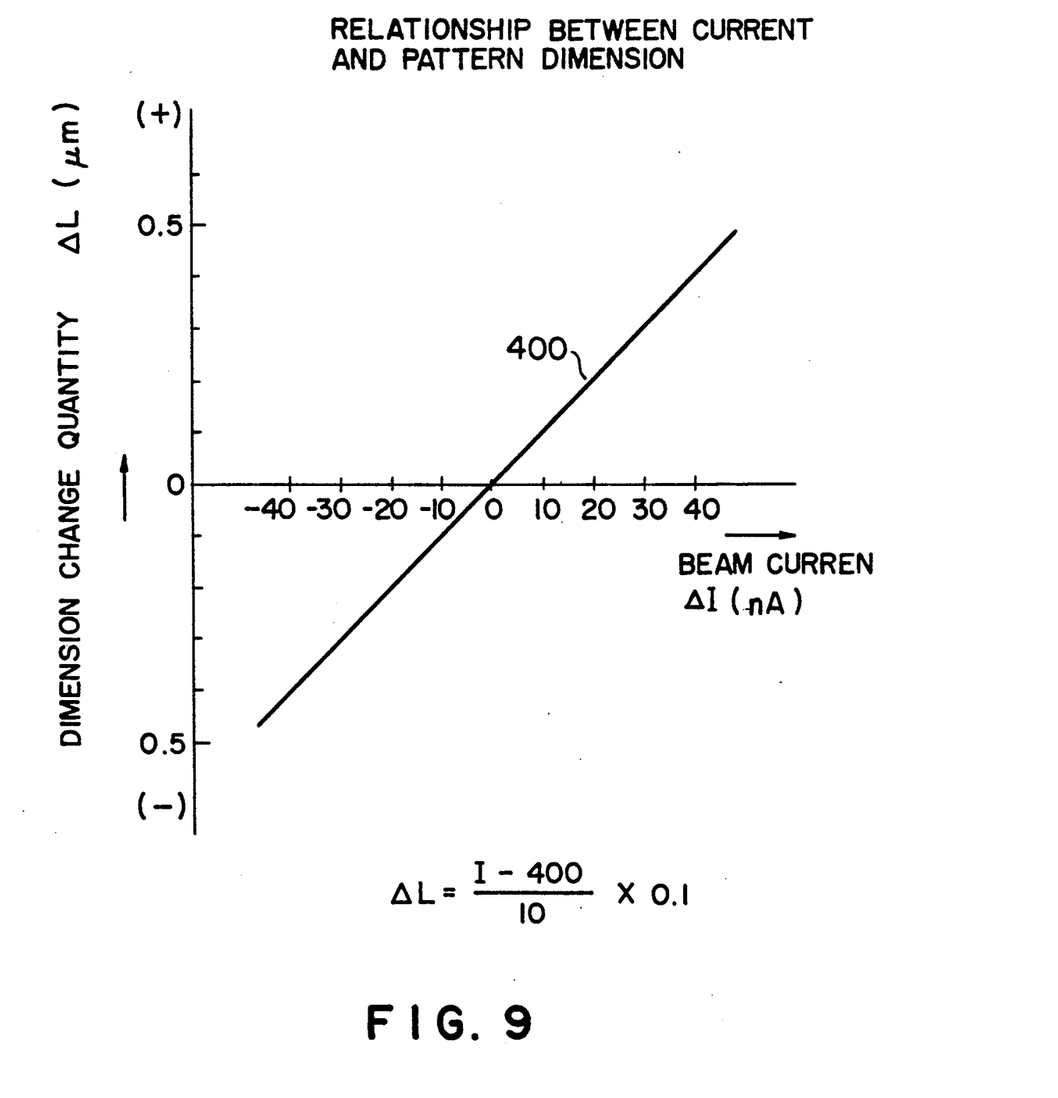
FIG. 9 is a graph showing the relationship between a beam current and a pattern width change quantity.

FIG. 9 is a graph showing a dimension change quantity $\Delta L$ in the case where the beam current of value is varied using a beam current 400 nA as a reference on the basis of FIG. 8. From this Figure, it is seen that the pattern width dimension is varied by 0.1 $\mu$m every time the beam current value is varied by 10 nA.

Accordingly, in order to cancel a change quantity in the dimension shown in FIGS. 1 and 2, it is sufficient to deliver, in dependency upon the irradiation position, a beam current such that a dose quantity of an electron beam is constant within the substrate.

Figure 10:
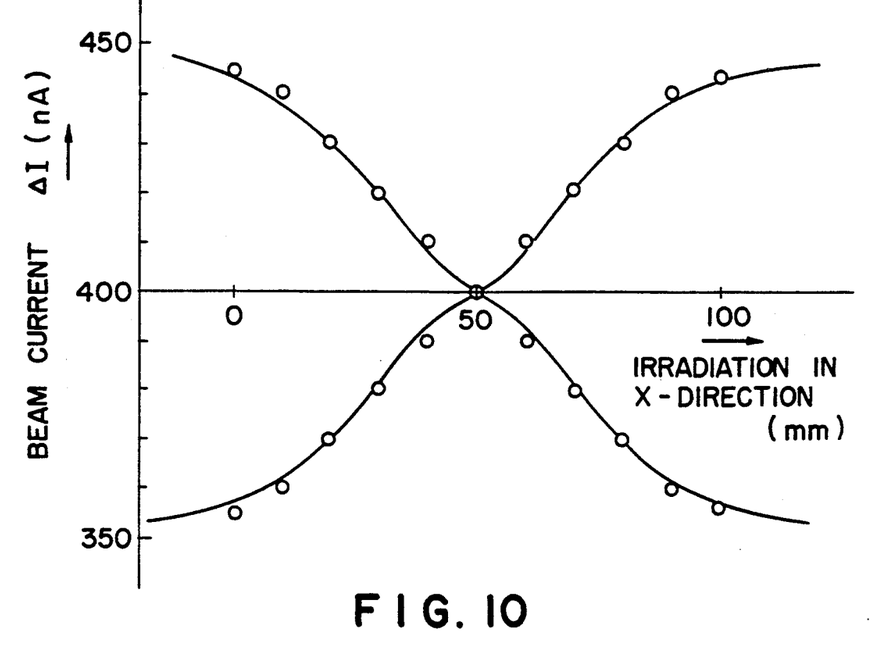
FIG. 10 is a graph showing a beam current value actually given.

FIG. 10 is a graph showing the behavior of such a current change, wherein change quantities in X- and Y-directions with respect to, e.g., a reference current of I=400 $\mu$A are shown. With respect to an ordinary remaining pattern, as indicated on the upper side of the graph, the beam current is increased by 50 $\mu$A at the peripheral portion. On the other hand, with respect to an extraction pattern, as indicated on the lower side of the graph, the beam current is decreased by 50 $\mu$A at the peripheral portion.

Figure 11:
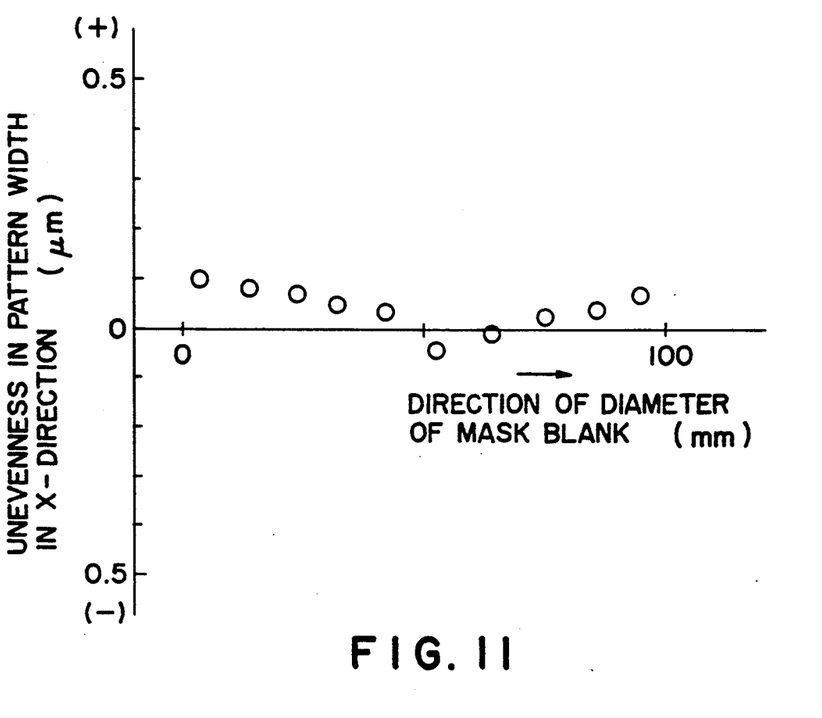
FIGS. 11 and 12 are graphs showing the reduction effect of unevenness in the pattern width according to this invention, respectively.
Figure 12:
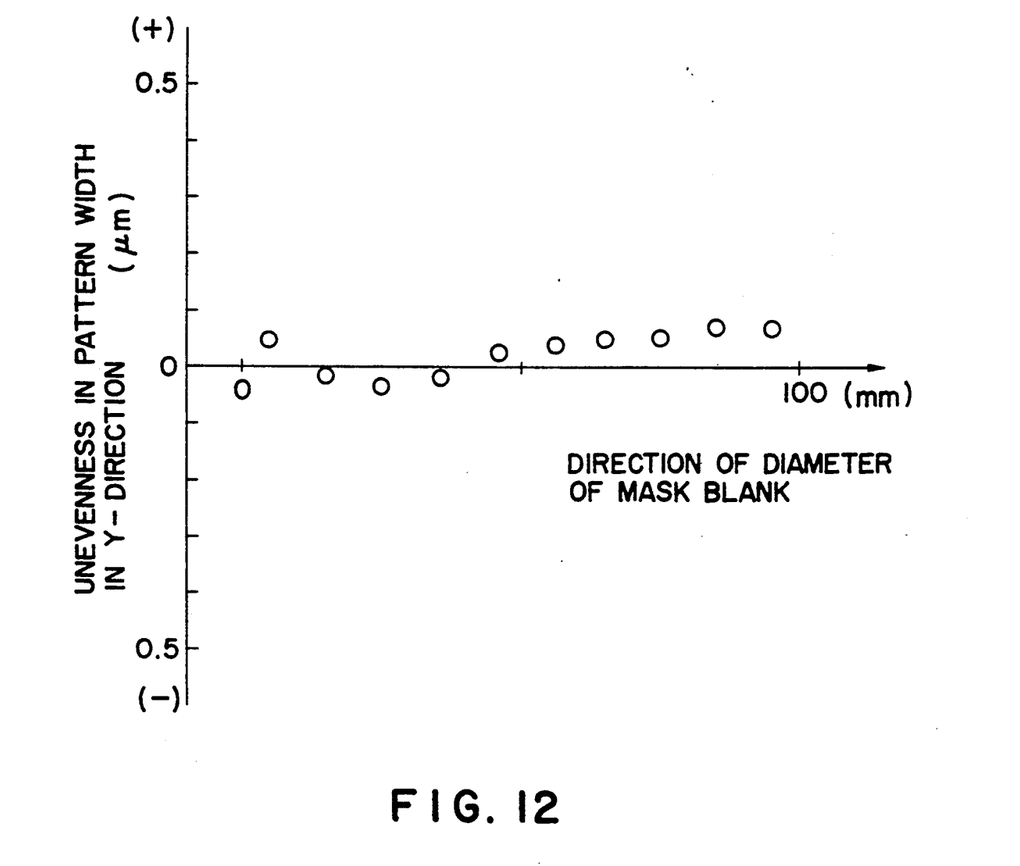

The result provided by measuring the pattern dimension obtained when the exposure processing is implemented by using such an apparatus will now be described. FIGS. 11 and 12 show the results obtained by measuring the unevennesses in the pattern dimension in X- and Y-directions, respectively. These figures show a distribution with respect to a direction of diameter on the mask blank 109. As seen from the above, the unevenness in the pattern dimension falls within a range of ±0.1 $\mu$m even at the peripheral portion. When compared to the unevenness (+0.5 to −0.1 μm) in the conventional case shown in FIGS. 1 and 2, a great improvement effect is provided.

This is because as the irradiation position shifts to the peripheral portion (apt to be subjected to fogging exposure) the dose quantity of an electron beam is decreased, so exposure is uniformly implemented in the entire region of the mask blank. As stated above, in accordance with this invention, the pattern dimension is kept constant, and manufacturing yield and/or reliability are improved.

It is to be noted that a change quantity of a beam current can be varied in dependency upon the kind of resist, the development time, or the like. Accordingly, an approach may be employed to input an instruction therefor from a keyboard, etc. by an operator to instruct the exposure control circuit 6 to effect a required control.

What is claimed is:

1. A method for exposing a mask blank using an electron beam, comprising the steps of:
    performing irradiation of said electron beam onto said mask blank by scanning said beam; and
    repeating said irradiation to cover an entire surface of said mask blank;
    wherein beam current is controlled in response to position information only such that a dose quantity of said electron beam is made uniform over said entire surface of said mask blank by decreasing beam current in accordance with irradiation position as said irradiation position shifts from a central position to a peripheral position.

2. An apparatus for applying an exposure onto a semiconductor manufacturing mask blank using an electron beam, said apparatus comprising:
    an electron gun to irradiate and scan said electron beam onto a surface of said mask blank;
    stage driving means for moving a stage on which said mask blank is supported;
    position detecting means for detecting a position of said stage; and
    beam current control means for adjusting a dose quantity of an electron beam outputted from said electron gun such that said dose quantity of said electron beam is made uniform over the entire surface of said mask blank by controlling a beam current such that beam current decreases in accordance with irradiation position only as said irradiation position shifts from a central position to a peripheral position.

* * * * *